(12) United States Patent
Von Mansberg et al.

(10) Patent No.: US 12,432,507 B2
(45) Date of Patent: Sep. 30, 2025

(54) ELECTRONICS MODULE AND HEARING INSTRUMENT BASE MODULE FOR A HEARING INSTRUMENT TO BE WORN IN THE AUDITORY CANAL, HEARING INSTRUMENT TO BE WORN IN THE AUDITORY CANAL

(71) Applicant: Sivantos Pte. Ltd., Singapore (SG)

(72) Inventors: Thilo Von Mansberg, Erlangen (DE); Marco Steffen, Löhne (DE); Alexander Menke, Löhne (DE)

(73) Assignee: Sivantos Pte. Ltd., Singapore (SG)

( * ) Notice: Subject to any disclaimer, the term of this patent is extended or adjusted under 35 U.S.C. 154(b) by 187 days.

(21) Appl. No.: 18/345,117

(22) Filed: Jun. 30, 2023

(65) Prior Publication Data

US 2024/0007805 A1    Jan. 4, 2024

(30) Foreign Application Priority Data

Jun. 30, 2022   (DE) ...................... 10 2022 206 739.8

(51) Int. Cl.
*H04R 25/00*   (2006.01)
*H04R 1/10*   (2006.01)

(52) U.S. Cl.
CPC ......... *H04R 25/602* (2013.01); *H04R 1/1025* (2013.01); *H04R 25/609* (2019.05); *H04R 2225/31* (2013.01)

(58) Field of Classification Search
CPC ................ H04R 25/609; H04R 25/602; H04R 2225/025; H04R 2225/31; H04R 2225/57; H05K 1/189
USPC .................................. 381/312, 323, 324, 328
See application file for complete search history.

(56) References Cited

U.S. PATENT DOCUMENTS

| | | |
|---|---|---|
| 11,758,340 B2 | 9/2023 | Zhang |
| 2014/0348362 A1 | 11/2014 | Helgeson et al. |
| 2021/0306730 A1 | 9/2021 | Knudsen |

FOREIGN PATENT DOCUMENTS

| | | |
|---|---|---|
| CN | 113015075 A | 6/2021 |
| DE | 102010051626 A1 | 5/2012 |

*Primary Examiner* — George C Monikang
(74) *Attorney, Agent, or Firm* — Laurence A Greenberg; Werner H. Stemer; Ralph E. Locher

(57) ABSTRACT

An electronics module for a hearing instrument to be worn in the auditory canal has a rechargeable battery, a mechanical holder, in which the rechargeable battery is received in the intended assembly state of the electronics module, a circuit carrier, and a chipset arranged on the circuit carrier. The circuit carrier is band-shaped and in the intended assembly state is laid in sections and bent around the mechanical holder. There is also described a hearing instrument module and a complete hearing instrument.

17 Claims, 7 Drawing Sheets

ELECTRONICS MODULE AND HEARING INSTRUMENT BASE MODULE FOR A HEARING INSTRUMENT TO BE WORN IN THE AUDITORY CANAL, HEARING INSTRUMENT TO BE WORN IN THE AUDITORY CANAL

CROSS-REFERENCE TO RELATED APPLICATION

This application claims the priority, under 35 U.S.C. § 119, of German Patent Application DE 10 2022 206 739.8, filed Jun. 30, 2022; the prior application is herewith incorporated by reference in its entirety.

FIELD AND BACKGROUND OF THE INVENTION

The invention relates to an electronics module and a hearing instrument base module for a hearing instrument to be worn in the auditory canal. In addition, the invention relates to such a hearing instrument to be worn in the auditory canal.

Hearing instruments are typically used to output a sound signal to the sense of hearing of the wearer of the hearing device. The output takes place here by means of an output transducer, usually acoustically via airborne sound by means of a loudspeaker (also referred to as a "receiver"). Such hearing instruments are often used as so-called hearing aid devices (also in short: hearing aids). For this purpose, the hearing instruments normally comprise an acoustic input transducer (in particular a microphone) and a signal processor, which is configured to process the input signal (also: microphone signal) generated by the input transducer from the ambient sound with application of at least one signal processing algorithm, typically stored specifically by a user, in such a way that a hearing loss of the wearer of the hearing instrument is at least partially compensated for. In particular in the case of a hearing aid device, the output transducer, in addition to a loudspeaker, can also alternatively be a so-called bone vibrator or a cochlear implant, which are configured for mechanically or electrically coupling the sound signal into the sense of hearing of the wearer. The term hearing instrument in particular also includes devices such as so-called tinnitus maskers, headsets, headphones, and the like.

Typical structural forms of hearing instruments, in particular hearing aids, are behind-the-ear ("BTE") and in-the-ear ("ITE") hearing instruments. These designations are directed to the intended wearing position. Thus, behind-the-ear hearing instruments have a (main) housing, which is worn behind the pinna. It is possible to distinguish here between models, the loudspeaker of which is arranged in this housing—the sound output to the ear typically takes place by means of a sound tube, which is worn in the auditory canal—and models which have an external loudspeaker, which is placed in the auditory canal. In-the-ear hearing instruments, in contrast, have a housing which is worn in the pinna or even completely in the auditory canal.

ITE hearing instruments (also abbreviated: "ITEs") usually also have different embodiments, namely models which are worn completely "countersunk" in the auditory canal (among other things, also designated as "CIC" for "completely in canal"), and models which are partially inserted in the auditory canal and partially exposed in the pinna.

The energy supply of the electrical and electronic components, in particular the signal processor, of the microphone and loudspeaker, is increasingly carried out by means of secondary cells, i.e., rechargeable batteries. With regard to ITEs, it is problematic here that secondary cells, if they are supposed to remain permanently installed in the hearing instrument, in order not to have to be changed similarly to conventional battery cells, require energy management, which, on the one hand, monitors the state of charge of the secondary cell, controls the supply of the charging energy to the secondary cell during a charging process, and controls the energy distribution onto the electrical and electronic components during operation. Moreover, means for receiving the charging energy, thus in particular at least two contacts at different electrical potentials, are necessary. These required components are known to require installation space, which is only available to a limited extent in particular in ITEs, especially in CICs.

The installation space, which is only available to a limited extent, thus has to be used as efficiently as possible. Among other things, it is also problematic here that electromagnetic interference fields can occur between signal processor and energy management and/or charging contacts, which are to be avoided (often also referred to as electromagnetic compatibility). In addition, the respective components also have to be mechanically mounted.

SUMMARY OF THE INVENTION

It is accordingly an object of the invention to provide a device which overcomes the above-mentioned disadvantages of the heretofore-known devices of this general type and which provides for a generally improved ITE hearing instrument.

With the above and other objects in view there is provided, in accordance with the invention, an electronics module for a hearing instrument to be worn in the auditory canal, the electronics module comprising:
  a rechargeable battery;
  a mechanical holder configured to receive said rechargeable battery in an intended assembly state of the electronics module;
  said mechanical holder being formed as a clamp and, in the intended assembly state, partially enclosing a circumference of said rechargeable battery;
  a circuit carrier and a chipset disposed on said circuit carrier;
  said circuit carrier being band-shaped and, in the intended assembly state, being laid in sections on said mechanical holder and bent around said mechanical holder; and
  said circuit carrier holding said mechanical holder in a closing direction.

In other words, the electronics module according to the invention is configured and provided for use in a hearing instrument to be worn in the auditory canal, or ear canal. The type of hearing instrument is identified by its acronym "ITE"). The electronics module includes a rechargeable battery, a mechanical holder (in particular solely mechanical, i.e., not assuming any electrical functions), in which the rechargeable battery is received in the intended installation state of the electronics module, and a circuit carrier (in particular a circuit board, preferably a printed circuit board (also: "PCB")). The electronics module preferably includes a microphone arranged on the circuit carrier. In addition, the electronics module includes a chipset arranged on the circuit carrier. The circuit carrier is designed as band-like and is laid in sections and bent around the mechanical holder in the intended assembly state.

The mechanical holder is optionally also designated hereinafter as a "frame" or "electronics frame", since as described above this is used to hold at least a part of the electrical and electronic components of the hearing instrument, in any case the electronics module.

The term "chipset" is understood here and hereinafter in particular as an interconnection of multiple electronic components, preferably including integrated circuits, for example in the form of microprocessors and/or ASICs. In particular, the chipset forms at least one audio processor (also: "signal processor") and/or an energy management electronics unit here. The audio processor is preferably configured to process audio signals, for example signals generated by means of the microphone on the basis of received airborne sound, in a user-specific manner, in particular to filter and/or amplify them depending on frequency in the case of a hearing a device.

Because the PCB is laid bent around the holder and the battery held therein, a compact design is advantageously enabled, in particular also because batteries—even rechargeable batteries—often have smaller dimensions than PCBs equipped for use in hearing instruments. The PCB can therefore be at least roughly adapted to the contour of the battery, which in turn enables a better space utilization.

The energy management electronics unit is preferably configured to supply charging energy during a charging process of the rechargeable battery, and to supply operating energy from the rechargeable battery at least to the audio processor during the intended operation of the ITE. The energy management electronics unit preferably comprises at least one chip in the form of a so-called power management integrated circuit ("PMIC") for this purpose.

The mechanical holder has a clamp-like design, that is it is configured to function as a clamp. In the intended assembly state, the holder partially encloses the circumference of the rechargeable battery and is held here by means of the PCB in the closed position, in particular obstructed from bending open. The holder is preferably loaded here in such a way that a clamping force is exerted or increased on the battery. The battery is thus advantageously held in a friction-locked manner, which simplifies handling of the electronics module during the assembly of the ITE.

The PCB is expediently additionally arranged so that the rechargeable battery is arranged at least partially between the audio processor and the energy management electronics unit. In other words, the PCB is bent and encloses the battery in such a way that the latter is arranged on a type of chord (in the meaning of circular arc chord, even if the PCB is not bent in a circular arc) between audio processor and energy management electronics unit. The battery can thus unfold an electromagnetic shield effect, so that the electromagnetic compatibility of the audio processor is improved.

In one expedient embodiment, the mechanical holder is designed as essentially ring-shaped having a ring opening, thus in particular approximately C-shaped, and includes a hook-in structure facing away from the ring opening on an outer side. The PCB includes a hook structure corresponding to the hook-in structure, by means of which the PCB is hooked in the hook structure. For example, the hook-in structure of the holder is designed in the form of a hook-like undercut in the outer surface of the holder. Hooking enables comparatively simple handling during the assembly, since typically the structures corresponding to one another only have to be pushed one inside the other.

In one expedient refinement, the PCB is arranged extending over the ring opening of the (mechanical) holder (thus extends over the ring opening). In addition, the PCB is fixed on the mechanical holder on the side of the ring opening opposite to the hook-in structure. The PCB is preferably adhesively bonded at this point. Hooking is also possible in principle here. To be able to form the above-described tension easily, the adhesive bonding is advantageous, since mechanical locking requires comparatively narrow manufacturing tolerances for precise positioning in the circumferential direction, which can in turn be compensated for by an adhesive bond.

An end section of the PCB is preferably folded over to form the hook structure of the PCB. The PCB in particular includes a first end area, in which the above-described audio processor is also arranged, a middle area delimited in the band longitudinal direction from the first end area, and a second end area, which adjoins the middle area opposite to the first end area. The folded-over end section is preferably arranged here in the first end area.

In particular, the end section is adhesively bonded on an adjoining partial section of the PCB, in particular of the first end area. To enable hooking with the hook-in structure, a hooking area, which is in particular formed by an edge strip of the band-type PCB in each case, expediently remains free of adhesive here. In this hooking area, specifically in this edge strip, expediently no electrical components are applied to the PCB either.

The hook-in structure is preferably accordingly formed by two webs protruding from the mechanical holder but facing away from the ring opening, under which the PCB will be or is inserted with its hooking area, in particular with the respective edge strip.

At least one chip (which preferably forms the audio processor or at least a part thereof) is inserted between the above-mentioned end section and the partial section (in particular of the first end area of the PCB). The chip specifies a minimum distance between end section and partial section with its structural height here. Two chips, which jointly form the "core" of the audio processor, are preferably inserted between these sections. Preferably, one chip is arranged on the end section and the other chip on the partial section here, so that this is inserted between these sections "back-to-back" in the folded state of the PCB. Preferably, both chips specify the distance between the two sections with their structural height (possibly plus an allowance for an adhesive layer).

The energy management electronics unit is preferably arranged in the middle area of the PCB. In particular, the above-mentioned microphone is also arranged in the middle area, preferably on a side of the PCB facing toward the rechargeable battery. The microphone is assigned a passage ("sound hole") in the PCB here, which aligns with a sound entry opening of the microphone. The microphone is in addition expediently arranged closer to the folded-over end section than the energy management electronics unit. As much space as possible can thus be introduced between the audio processor and the energy management electronics unit, so that in the bent state, the battery can be arranged as easily as possible and with the largest possible section between the energy management electronics unit and the audio processor.

In a further expedient embodiment, at least one contact strip of the PCB having contacting points (in particular solder pads) for at least one further electronic component protrudes from the end section or the partial section (of the first end section) beyond a folded edge (i.e., the edge around which the end section is folded over) between end section and main section. This (or the respective) contact strip is in particular formed by a lengthwise slot, which separates the contact strip from the end section or the partial section in the longitudinal direction and leaves it connected to the partial section or the end section at the end side (in the area of the folded edge), so that this contact strip is "oriented"—specifically not also folded over—upon folding over of the end section and protrudes beyond the folded edge in extension toward the partial section or toward the end section.

A receiver (loudspeaker) and/or a "MI antenna", specifically an induction coil, which is configured for wireless, magnetic-inductive signal transmission, is used as the electronic component which is electrically connected to the contact section in the intended final assembly state of the ITE.

In a further expedient embodiment, the mechanical holder has first and second positioning aids protruding laterally, in particular in end areas (or: edge areas) on both sides of the ring opening. "Laterally protruding" is understood here in particular to mean that these positioning aids protrude in the direction of a ring axis. These positioning aids are engaged here in an intended assembly state of the ITE with corresponding first and second positioning aids of a housing element of the hearing instrument for mutual positioning.

In particular, the first and second positioning aids of the mechanical holder are formed as pins. The corresponding positioning aids of the housing element are preferably formed as recesses, optionally holes, but in particular as grooves or clamp-like recesses, into each of which the pins can be inserted transversely to the pin axis.

In a further expedient embodiment, the mechanical holder includes a bolting eye (i.e., a hole), which is used to receive a securing pin for connecting the mechanical holder at least of the housing element. The first and second positioning aids are preferably configured here to hold the bolting eye in an intermediate assembly step congruent with a corresponding hole in the housing element of the hearing instrument. For this purpose, the corresponding positioning aids in the housing element are preferably formed in such a way that the mechanical holder is held in two spatial directions placed at an angle in relation to one another (greater than zero and less than 180°). It is thus possible to effectively prevent the electronics module fastened on the housing element, in particular at least the mechanical holder, from being able to be displaced, at least except for play within and due to typical tolerances.

In one preferred embodiment, the electronics module includes a charging contact arrangement for recharging the rechargeable battery. This charging contact arrangement is arranged here on the PCB on a side facing away from the rechargeable battery. The charging contact arrangement preferably comprises two charging contacts assigned to different electrical potentials.

The charging contact arrangement is preferably arranged in the second end area of the PCB and thus on the end of the PCB opposite to the folded-over end section. An energy flow, in particular a current flow, which is also advantageous with respect to the above-mentioned EMC aspects is thus enabled. This is because during a charging process, current expediently flows first from the charging contact arrangement to the energy management electronics unit arranged in the adjacent middle area (and in particular also adjacent to the charging contact arrangement), which possibly converts (transforms) the (charging) current and supplies it to the battery. In the intended operation of the ITE, in contrast, operating energy (thus in particular current) flows from the battery via the energy management electronics unit to the microphone preferably arranged adjacent and furthermore to the first end area, specifically to the signal processor arranged there.

The hearing instrument base module according to the invention (in short: base module) is configured and provided for use with the above-mentioned ITE. The base module includes the above-described electronics module and the housing element of the ITE discussed above. The housing element includes at least one microphone opening. In addition, the housing element is fastened on the electronics module in such a way that the microphone of the electronics module is fluidically connected to the surroundings through the microphone opening in the intended final manufacturing state of the ITE. In particular, the microphone opening thus aligns with the corresponding passage in the PCB assigned to the microphone and the sound entry opening of the microphone.

The electronics module preferably includes a ring seal, which is arranged between the PCB and the housing element circumferentially around the microphone opening. The electronics module is expediently braced against the housing element here by means of the respective first and second positioning aids (of the mechanical holder and the housing element) while loading the ring seal. The seal pressure is thus advantageously applied between housing element and electronics module.

In one preferred embodiment, the housing element is designed as essentially L-shaped having a long leg and a short leg placed approximately at a right angle thereto (i.e., preferably between 75 and 110°). The microphone opening is arranged here in the long leg, preferably in a free end area of the long leg. In the intended final assembly state of the ITE, the long leg forms a housing terminus facing toward the open end of the auditory canal, classically also designated as a "faceplate". A charging opening is arranged in the short leg, through which the charging contact arrangement is accessible. The short leg is preferably arranged approximately in parallel to the auditory canal wall in the intended worn state of the ITE and is therefore not visible from the pinna. A (further) ring seal is expediently mounted between the housing element and the PCB extending around the charging opening, so that penetration of contaminants between the housing element and the PCB is prevented.

The base module, at least the housing element, is preferably constructed symmetrically with respect to the geometrical external structures, i.e., the structures which are visible from an outside in the intended final assembly state and which are used for the mechanical connection to further components of the ITE. The base module can thus be used similarly for "left" and "right" ITEs (thus provided to be worn in the left or right ear), so that the number of identical parts can advantageously be increased in manufacturing.

The ITE according to the invention includes the above-described base module. Furthermore, the ITE includes a main housing, which includes a housing opening facing away from the eardrum in the intended worn state. The base module is inserted into the main housing and closes this housing opening with the housing element. The main housing preferably includes a fastening hole, through which a securing pin (in particular the above-mentioned securing pin) extends in such a way that it also passes through the hole of the housing element and the bolting eye of the mechanical holder, by which three components are secured on one another by a common connecting element.

The above-described first and second positioning aids of the mechanical holder and the housing element are therefore advantageously used for the mechanical alignment and fixing of the electronics module with the housing element to form an installation intermediate assembly.

The ITE preferably also includes the above-mentioned receiver and/or the MI antenna, which preferably form a common integrated assembly, and which are arranged in the main housing and are contacted with the corresponding contact strips or the solder pads arranged thereon.

The base module and also the ITE therefore likewise have the features resulting from the description of the electronics module and advantages originating therefrom.

An assembly method for the electronics module, furthermore for the base module and the ITE, which also forms an independent invention, therefore comprises the following steps (following description based on the above-described components):

providing the mechanical holder;
providing the rechargeable battery;
providing the PCB;
providing the chipset and arranging it on the PCB;
inserting the battery in the mechanical holder; and
laying the PCB around and fastening it on the mechanical holder.

In addition (to form the base module) in particular:
providing the housing element; and
connecting the electronics module, preferably while engaging the respective first and second positioning aids with the housing element.

Forming the ITE:
providing the (preferably side-dependent, thus the left or right) main housing;
inserting the base module into the main housing; and
fixing the base module in the main housing.

The conjunction "and/or" is to be understood here and hereinafter to mean in particular that features linked by means of this conjunction can be formed both jointly and as alternatives to one another.

Other features which are considered as characteristic for the invention are set forth in the appended claims.

Although the invention is illustrated and described herein as embodied in an electronics module and hearing instrument base module for a hearing instrument to be worn in the auditory canal, hearing instrument to be worn in the auditory canal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Parts that corresponding to one another are provided with the same reference signs throughout the figures.

DETAILED DESCRIPTION OF THE INVENTION

Figure 1:
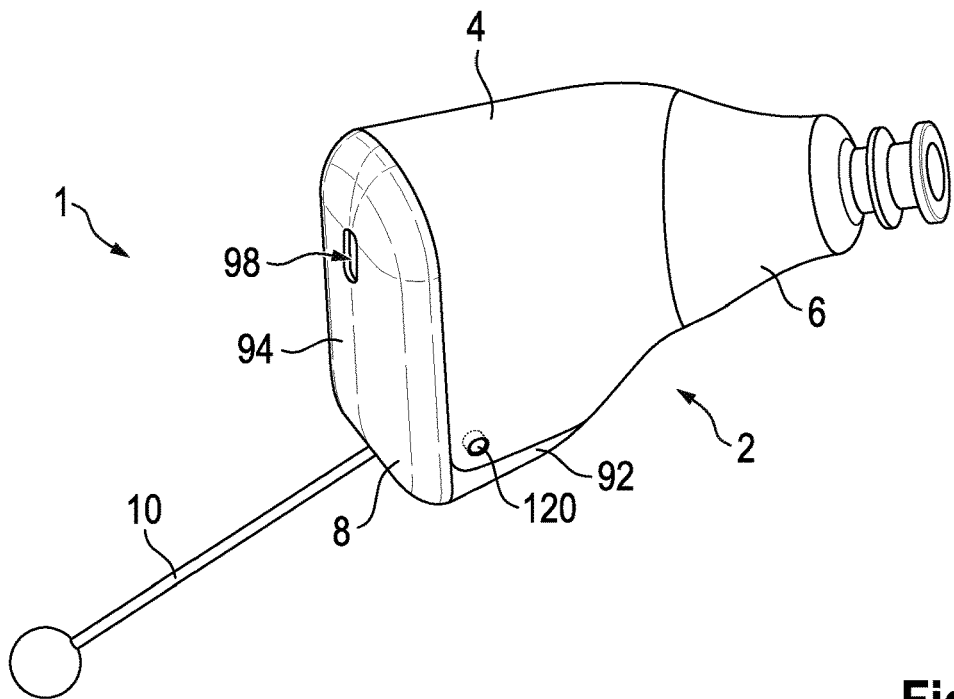
FIG. 1 is a schematic perspective view of a hearing instrument to be worn in the auditory canal.

Referring now to the figures of the drawing in detail and first, in particular, to FIG. 1 thereof, there is shown a schematic view of a hearing instrument 1, which is configured and provided to be worn in the auditory canal, also referred to as the ear canal, and is therefore designated hereinafter as ITE ("in the ear"). The ITE 1 includes an exterior housing 2, which is formed in the present exemplary embodiment by multiple housing elements. One housing element forms a main housing 4 (also designated as the housing middle part), a further housing element forms a housing tip 6 facing toward the eardrum in the intended worn state, and a third housing element forms a housing cover 8, which faces toward the exterior end of the auditory canal or is arranged thereon in the intended worn state. A cerumen guard and an earpiece (also designated as a "dome") are not shown in more detail in FIGS. 1 to 12. In addition, the ITE 1 includes a removal thread 10, or pull string, fastened on the housing cover 8.

Figure 2:
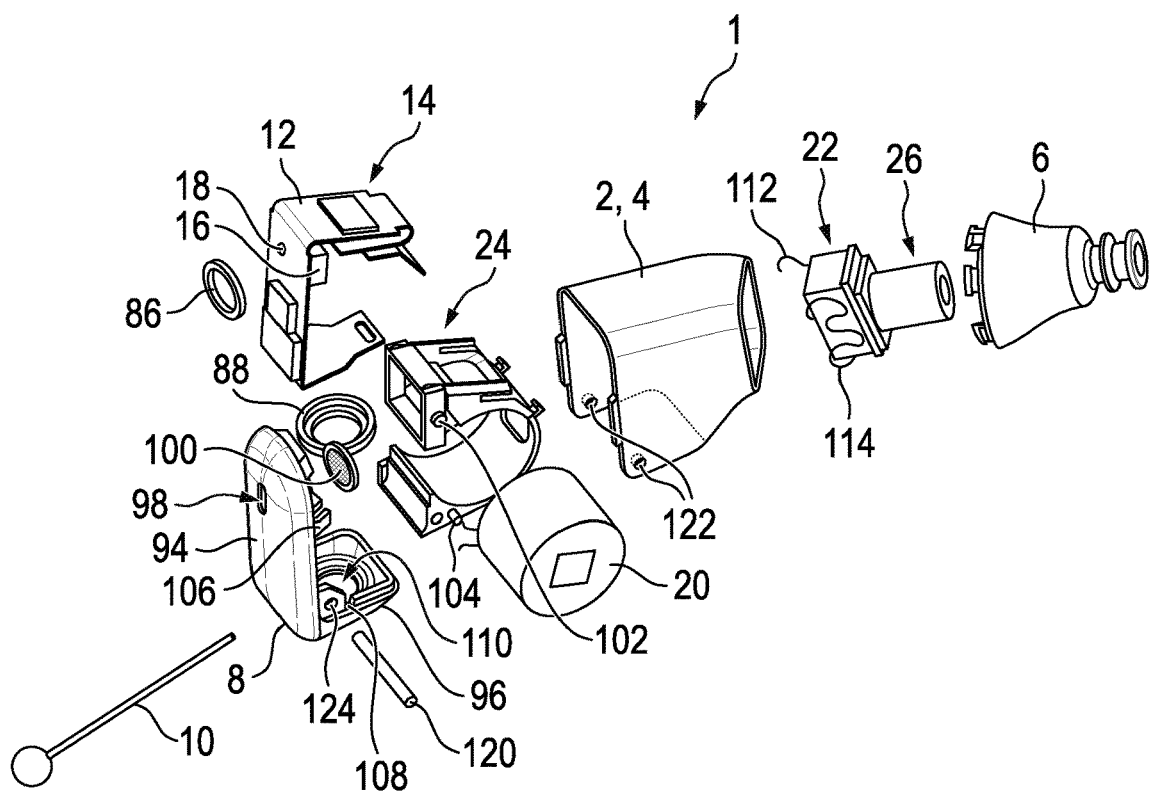
FIG. 2 is a schematic view of the hearing instrument in an exploded view.

FIG. 2 schematically shows further components of the ITE 1. The ITE 1 includes a circuit carrier, "PCB 12" here, on which electronic components in the form of a chipset 14—comprising multiple integrated circuits and electronic components—are arranged (see FIGS. 4, 5). Furthermore, a microphone 16 is arranged on the PCB 12, which is arranged here having a sound entry opening that is congruent with a sound hole 18 in the PCB 12. In addition, the ITE 1 includes a rechargeable battery 20, and a loudspeaker 22. The battery 20 is assigned a mechanical holder (in short: "frame 24"), in which the battery 20 is accommodated in the manner explained in more detail hereinafter. Moreover, the ITE 1 also includes an MI antenna 26, which is configured for a magnet-inductive communication between two ITE 1 in the scope of a binaural hearing system. This MI antenna 26 is arranged on a loudspeaker output channel ("spout", not shown). To charge the rechargeable battery 20, the ITE 1 also includes a charging contact arrangement 28 (see FIG. 5). The arrangement of these components and further components will be described in more detail hereinafter.

Figure 3:
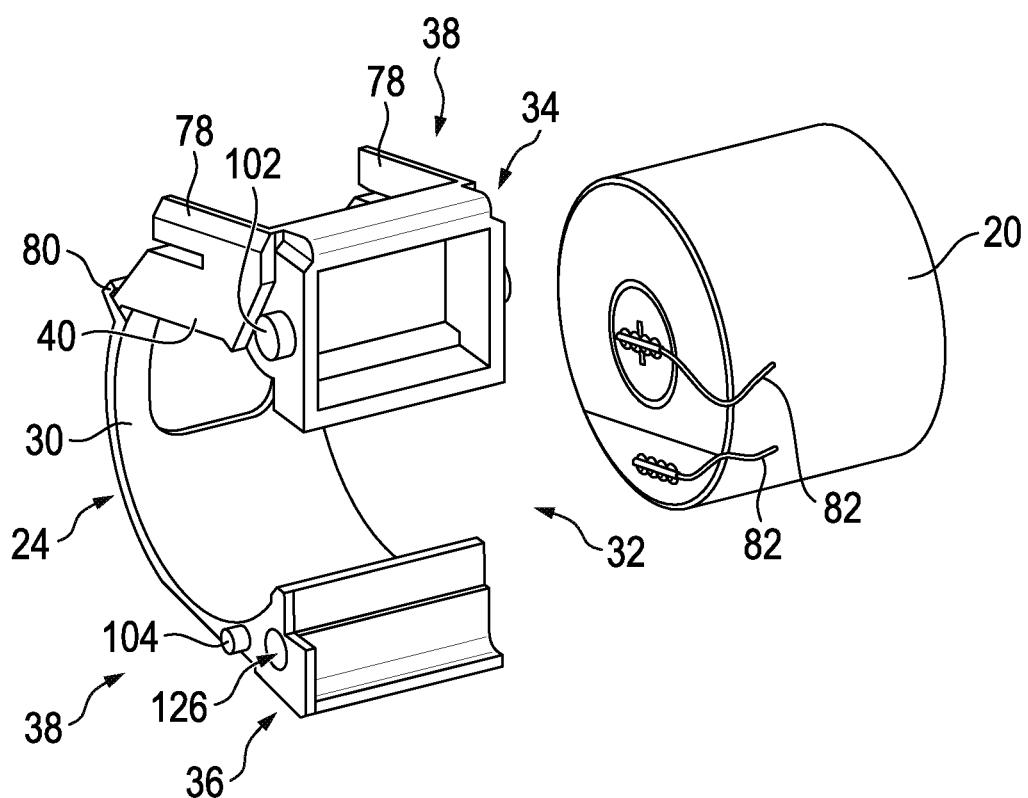
FIG. 3 schematically shows in a perspective view a battery cell of the hearing instrument and a mechanical holder for it.

The frame 24 is shown in more detail in FIG. 3. The frame 24 is made roughly C-shaped here, i.e., it includes a ring body 30 describing an arc of approximately a three-quarter circle, which is interrupted by a ring opening 32. Fastening structures 38 described in more detail hereinafter are formed at the upper and lower ends 34 and 36 of the ring body 30 opposite to the ring opening 32. The ring body 32 is dimensioned in such a way that the battery 20 can be inserted axially into the ring body 32—preferably with minor clamping. The frame 24 thus forms a clamp for the battery 20. To axially secure the battery 20 in the insertion direction, i.e., as an axial stop, the fastening structures 38 of the upper end 34 include a shoulder 40 protruding radially inward, against which the battery 20 presses upon the installation in the frame 24. The battery 20 is made circularly cylindrical comparable to a button cell.

Figure 4:
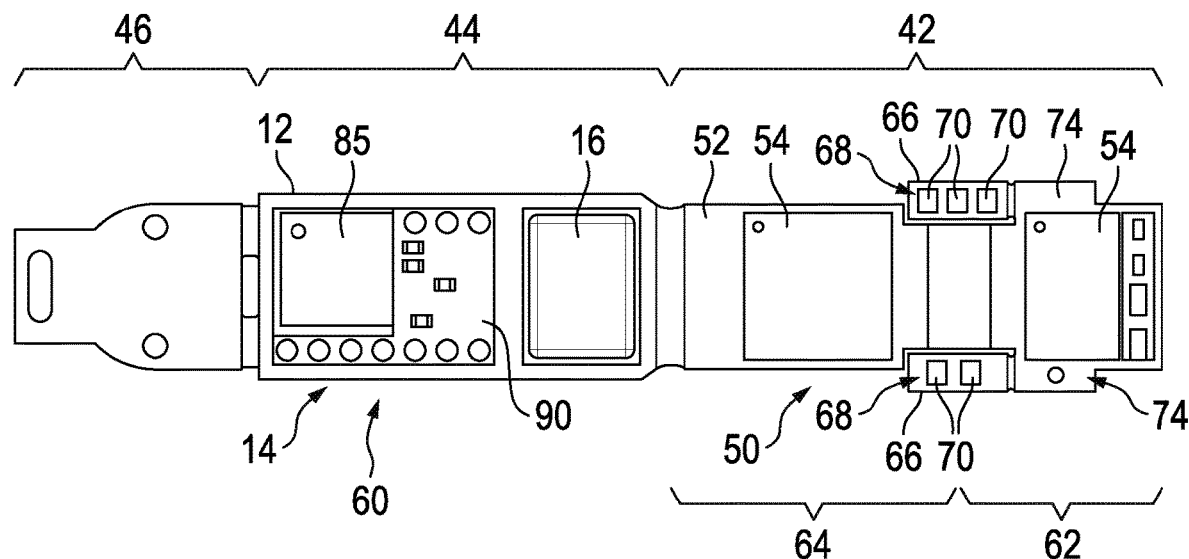
FIGS. 4-7 each schematically show in different views a circuit carrier of the hearing instrument in partly differing assembly states.
Figure 5:
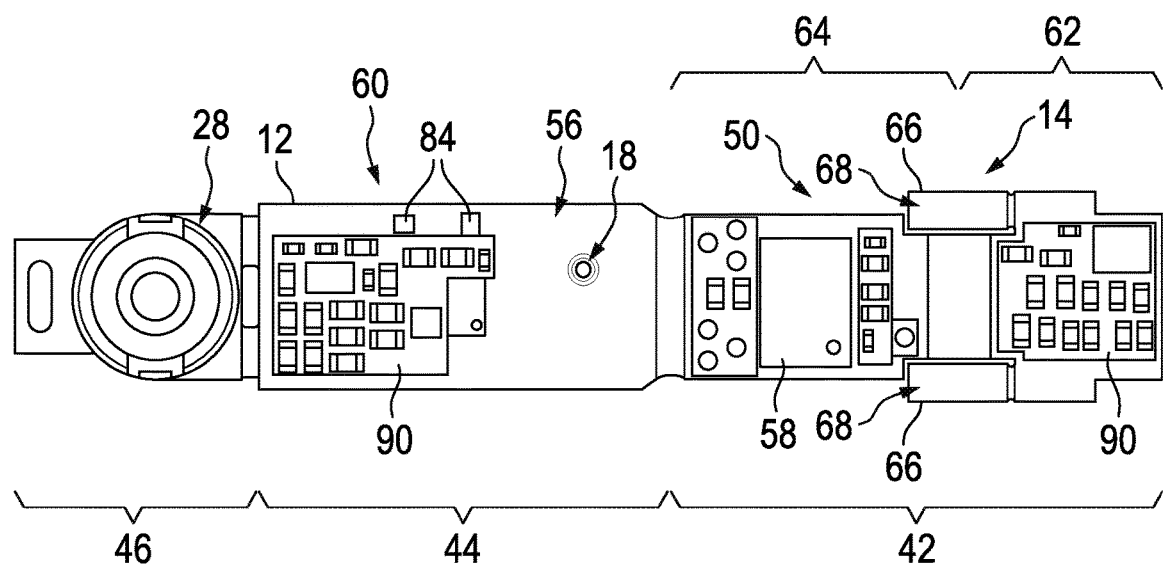
Figure 6:
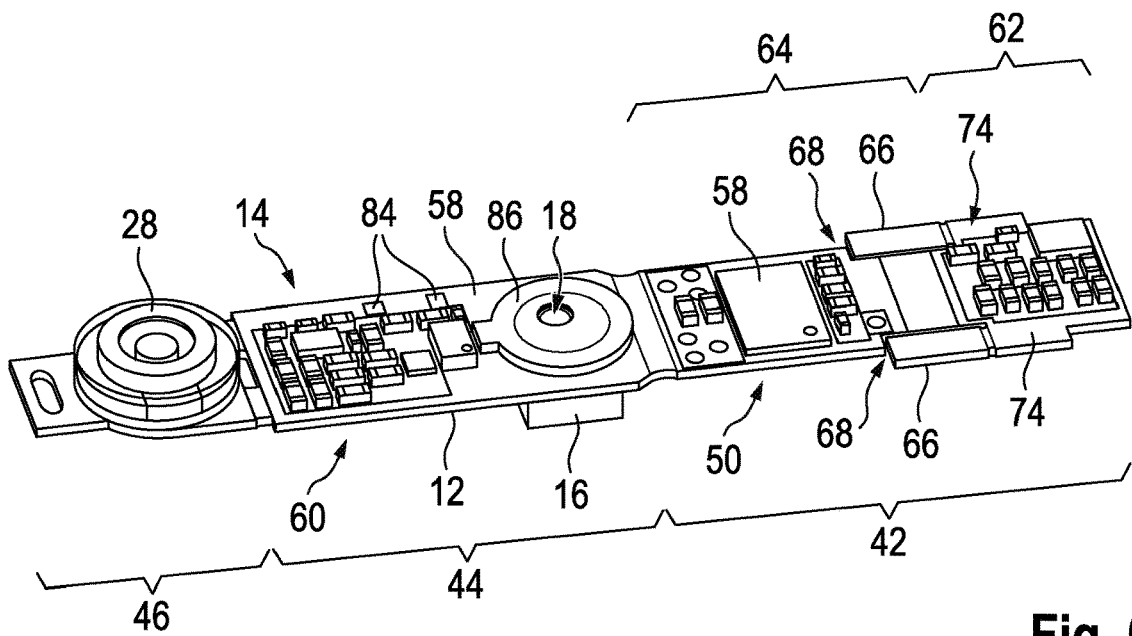

The PCB 12 is shown in an intermediate manufacturing step in FIGS. 4 and 5. The PCB 12 is designed as roughly band-shaped, i.e., comparatively long and narrow. The PCB 12 is subdivided here into a first end area 42, a middle area 44 adjoining thereon, and a second end area 46 adjoining the middle area 44 on the side opposite to the first end area 42. The chipset 14 is also subdivided here. A part of the chipset 14 which forms an audio processor 50 is arranged in the first end area 42. For this purpose, two chips 54 are arranged on a later "inside" 52 and a storage chip 58 is arranged on a later "outside" 56. The chipset 14 forms an energy management electronics unit 60 in the middle area 44. The microphone 16 is mounted between this and the audio processor 50 on the inside 52. The charging contact arrangement 28 is arranged on the outside in the second end area 46.

The first end area 42 is subdivided once again into an end section 62 and a partial section 64 facing toward the middle area 44. Two contact strips 66 are worked out of the PCB 12 by means of an L-shaped slot 68 on the edge side to the partial section 64. Each of these contact strips 66 bears multiple solder pads 70.

Figure 7:
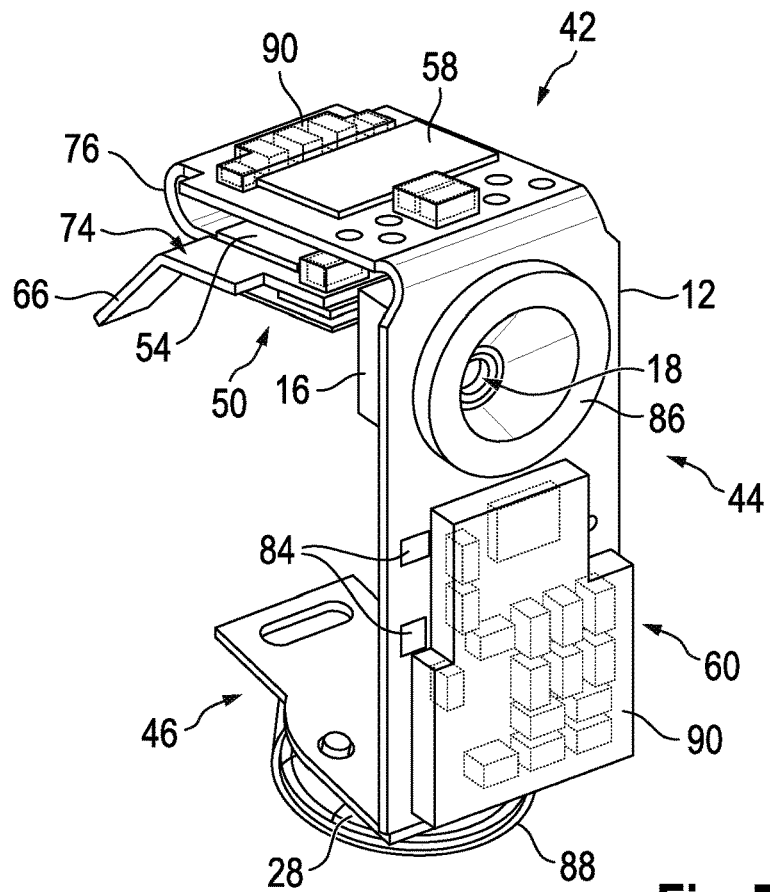
Figure 8:
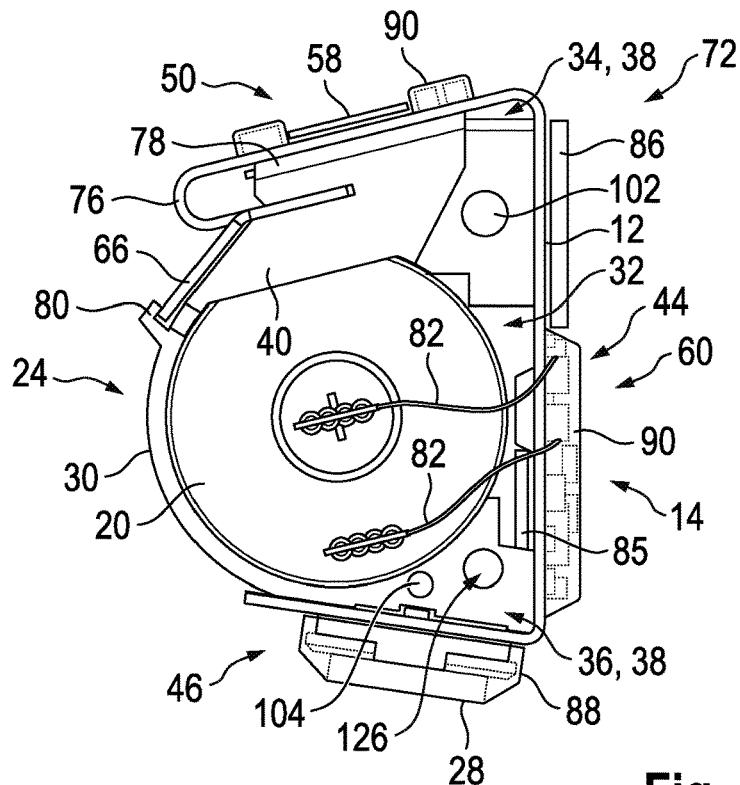
FIG. 8 is a schematic side view of an electronics module of the hearing instrument formed by the battery cell, the holder, and the circuit carrier.
Figure 9:
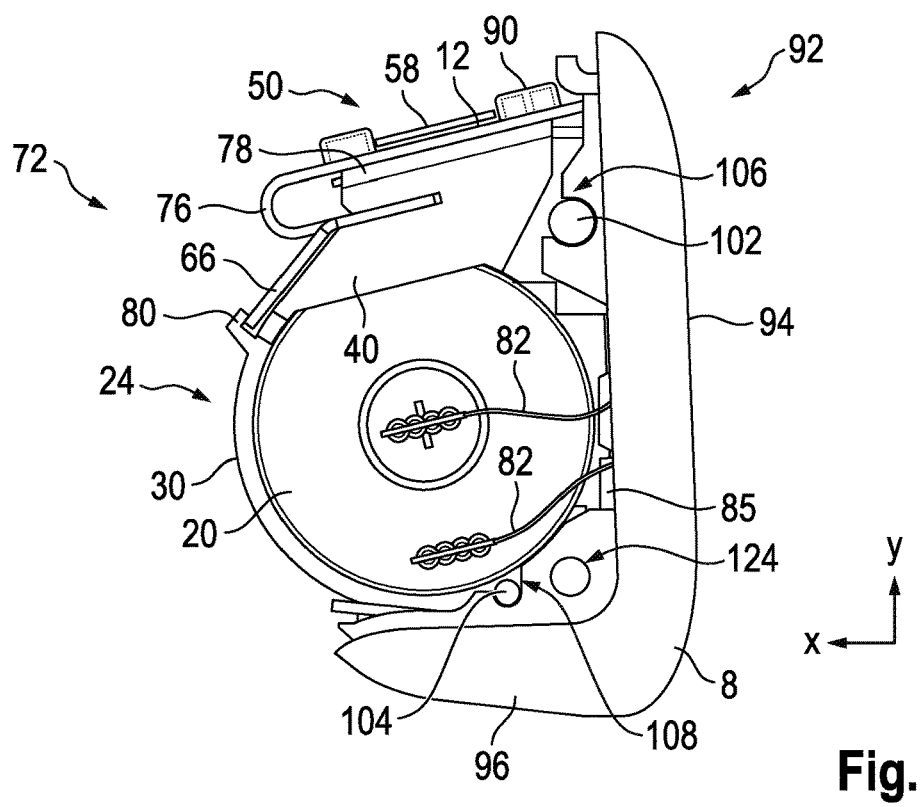
FIG. 9 is a schematic view, similar to FIG. 8, of a base module of the hearing instrument formed by the electronics module and a housing element.
Figure 10:
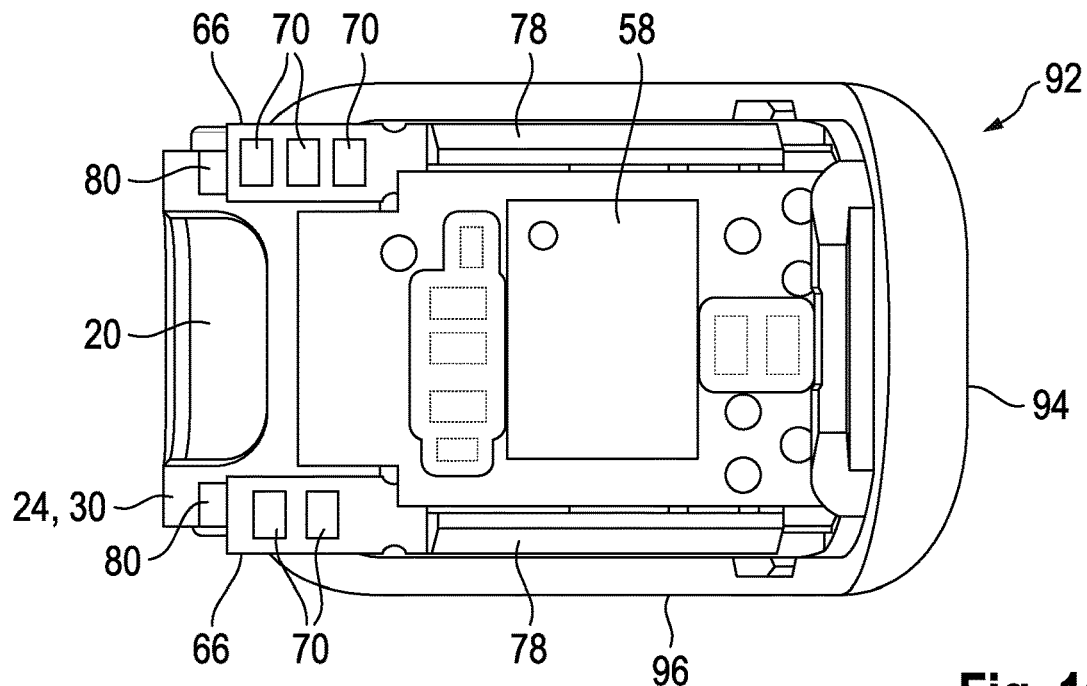
FIG. 10 is a schematic top view of an upper side of the base module.

FIGS. 7 and 8 illustrate how an electronics module 72 is formed from the frame 24, the battery 20, and the PCB 12. For this purpose, the end section 62 of the PCB 12 is folded over toward the inside 52, so that the two chips 54 press against one another with their rear sides. The end section 62 and the partial section 64 are adhesively bonded to one another in the area of the chips 54, in such a way that a hooking area (or edge strip 74) remains without adhesive at the edge. A hook-like structure is formed by folding over the end section 62. The contact strips 66 protrude here beyond a folded edge 76 extending between the end section 62 and the partial section 64. In addition, the PCB 12 is bent (folded) to form an approximate C-shape at each transition from the middle area 44 to the respective end area 42 and 46.

The battery 20 is inserted into the frame 24. The frame 24 has a hook-in structure in the form of two frame webs 78, which are directed away from the ring opening 32 and thus form an undercut, at the upper end 34 as part of the fastening structures 38. The PCB 12 is inserted (held) with the respective edge strip 74 into this undercut, specifically the gap between the respective frame web 78 (and the ring body 30), and thus secured in the tangential direction in the direction of the ring opening 32.

The contact strips 66 are bent in the direction toward the battery 20 and hooked in under a respective assigned holding lug 80 of the fastening structures 38 of the upper end 34 of the ring body 30 and thus secured.

The middle area 44 of the PCB 12 is laid over the ring opening 32 and the second end area 46 is laid over the lower end 36 of the frame 24. In addition, the second end area 46 is adhesively bonded to the lower end 36 and is therefore fixed on the frame 24. Due to this bending and laying of the PCB 12 around the frame 24, the latter is loaded in the "closing direction", i.e., a clamping effect is applied to the battery 20 or the clamping effect already possibly provided is increased. At least the frame 24 is secured against bending up, so that the battery 20 cannot inadvertently fall out.

Subsequently, contact lines 82 of the battery 20 are connected, specifically soldered, to corresponding contact connections (solder pads 84) of the PCB 12, which are assigned to the energy distribution electronics unit 60.

As is apparent from FIG. 8, the battery 20 is at least partially arranged on an imaginary direct connecting line between the energy management electronics unit 60 and the audio processor 50. At least the battery 20 is arranged between a chip 85 (in particular a PMIC) of the energy management electronics unit 60 and the audio processor 50, specifically its chips 54. The battery 20 can thus advantageously be used as a shield between these chips 54 and 85, so that electromagnetic interference of the audio processor 50 is avoided or reduced.

Furthermore, a ring seal ("microphone seal 86") is arranged on the PCB in the area circumferentially around the sound hole 18 and a further ring seal ("seal ring 88") is arranged circumferentially around the charging contact arrangement 28, in particular adhesively bonded on the PCB 12. As is apparent from FIGS. 4, 5, and 7, the electronic components of the PCB 12 are additionally coated using a casting resin 90 (shown transparent).

A base module 92 for the ITE 1 is formed jointly with the housing cover 8 and the electronics module 72. The housing cover 8 is formed L-shaped having a long leg 94 and a short leg 96, which is placed at approximately 85° to the long leg 94. A microphone opening 98 is arranged in the long leg 94 corresponding to the sound hole 18 and the microphone seal 86, in order to fluidically connect the microphone 16 to the surroundings. A protective grating 100, specifically a mono-filament grating, is arranged on the inside in front of the microphone opening 98 (see FIG. 1). Furthermore, the removal thread 10 is adhesively bonded in the housing cover 8.

First and second positioning aids are formed in each case on the frame 24 and on the housing cover 8 to connect the electronics module 72 to the housing cover 8. The first and second positioning aids of the frame 24 are designed as part of the fastening structures 38 here and as a detent pin 102 (first positioning aid) and as a positioning pin 104 (second positioning aid). An approximately C-shaped clamp 106 is formed as the first positioning aid on the long leg 94. A U-shaped groove 108 is formed as the second positioning aid on the short leg 96 of the housing cover 8. During the assembly, the electronics module 72 is initially inserted with the positioning pin 104 in the groove 108, which prevents a displacement of the electronics module 72 in a x direction, and subsequently clipped (locked) with the detent pin 102 in the clamp 106. The latter prevents a displacement in the y direction. The clipping (locking) takes place here with compression of both the microphone seal 86 and the seal ring 88 between PCB 12 and housing cover 8. The seal ring 88 borders a charging opening 110 in the short leg 96 of the housing cover 8 here (see FIG. 1), so that the charging contact arrangement 28 is externally accessible.

The base module 92 represents an intermediate manufacturing module which is stable as such. It is then connected to the remaining components of the ITE 1.

For this purpose, initially the loudspeaker 22 (having the MI antenna 26 arranged thereon) is inserted into the housing tip 6, specifically adhesively bonded around a sound outlet opening of the housing tip 6 to form a seal. The housing tip 6 is subsequently clipped in the main housing 4.

Bipolar contact lines 112 of the MI antenna 26 and tripolar contact lines 114 of the loudspeaker 22 are contacted, specifically soldered (not shown in more detail) with the solder pads 70 arranged on the contact strip 66.

Figure 11:
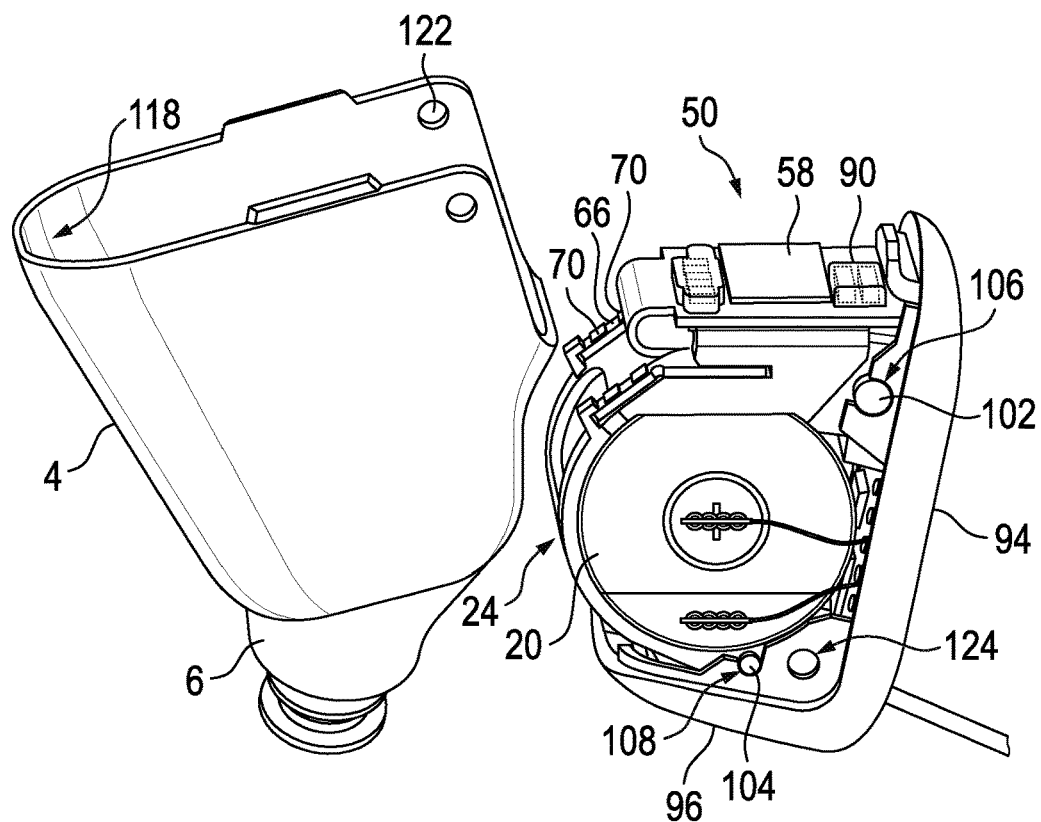
FIG. 11 is a schematic view, similar to FIG. 8, of the base module and a main housing of the hearing instrument in an intermediate manufacturing state.
Figure 12:
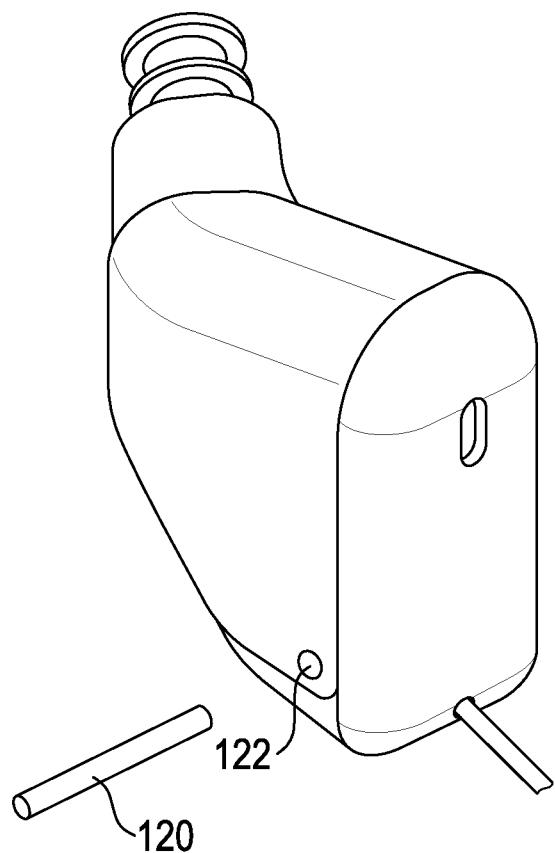
FIG. 12 is a schematic view of the hearing instrument in a further perspective view.

The base module 12 is then inserted with a hook 116 formed on the housing cover 8, specifically on the free end of the long leg 94, into a corresponding groove 118 in the main housing 4 and then pivoted with the short leg 96 in front into the main housing 4 (cf. FIG. 11). A securing pin 120 is then inserted through a fastening hole 122 in the main housing 4. The securing pin 120 extends here through a corresponding hole 124 of the housing cover 8 and through a bolting eye 126 of the frame 24 (which is in turn part of the fastening structures 38), by which the frame 24, the housing cover 8, and the main housing 4 are secured on one another by only one common connecting element.

The above-described cooperation of the first and second positioning aids of the frame 24 and the housing cover 8 not only holds these two parts together, but also positions bolting eye 126 and hole 124 aligned with one another. The installation of the securing pin 120 is then simplified.

The positioning of the charging contact arrangement 28 in the second end area 46, the energy management electronics unit 60 in the middle area 44, and the audio processor 50 in the first end area 42 also has—in addition to the above described use of the battery 20 as a shield in the intended assembly state—the advantage that an energy flow is expediently designed. During the charging, charging energy is supplied from the charging contact arrangement 28 on a short path, in comparison to the length of the PCB 12, to the energy management electronics unit 60 (which also assumes the function of a charging electronics unit) and from this to the battery 20—also on a short path. In "audio operation" of the ITE 1, the "branch" to the charging contact arrangement is inactive and the energy is supplied from the battery 20 via the energy management electronics unit 60 as operating energy to the microphone 16 and the audio processor 50 and indirectly via these to the loudspeaker 22.

It will be understood that the subject matter of the invention is not restricted to the above-described exemplary embodiment. Rather, further embodiments of the invention can be derived from the preceding description by a person skilled in the art.

The following is a summary list of reference numerals and the corresponding structure used in the above description of the invention:

- 1 ITE
- 2 exterior housing
- 4 main housing
- 6 housing tip
- 8 housing cover
- 10 removal thread
- 12 PCB
- 14 chipset
- 16 microphone
- 18 sound hole
- 20 battery
- 22 loudspeaker
- 24 frame
- 26 MI antenna
- 28 charging contact arrangement
- 30 ring body
- 32 ring opening
- 34 end
- 36 end
- 38 fastening structure
- 40 shoulder
- 42 end area
- 44 middle area
- 46 end area
- 50 audio processor
- 52 inside
- 54 chip
- 56 outside
- 58 storage chip
- 60 energy management electronics unit
- 62 end section
- 64 partial section
- 66 contact strip
- 68 slot
- 70 solder pad
- 72 electronics module
- 74 edge strip
- 76 folded edge
- 78 frame web
- 80 holding lug
- 82 contact line
- 84 solder pad
- 86 microphone seal
- 88 seal ring
- 90 casting resin
- 92 base module
- 94 leg
- 96 leg
- 98 microphone opening
- 100 protective grating
- 102 detent pin
- 104 positioning pin
- 106 clamp
- 108 groove
- 110 charging opening
- 112 contact line
- 114 contact line
- 116 hook
- 118 groove
- 120 securing pin
- 122 fastening hole
- 124 hole
- 126 bolting eye

The invention claimed is:

1. An electronics module for a hearing instrument to be worn in the auditory canal, the electronics module comprising:
    a rechargeable battery;
    a mechanical holder configured to receive said rechargeable battery in an intended assembly state of the electronics module;
    said mechanical holder being formed as a clamp and, in the intended assembly state, partially enclosing a circumference of said rechargeable battery;
    a circuit carrier and a chipset disposed on said circuit carrier;
    said circuit carrier being band-shaped and, in the intended assembly state, being laid in sections on said mechanical holder and bent around said mechanical holder; and
    said circuit carrier holding said mechanical holder in a closing direction;
    said mechanical holder being substantially ring-shaped with a ring opening and said mechanical holder being formed with a hook-in structure facing away from said ring opening on an outer side, and wherein said circuit carrier includes a corresponding hook structure configured to hook said circuit carrier into said hook-in structure.

2. The electronics module according to claim 1, wherein said circuit carrier is configured to load said mechanical holder in the closing direction, to thereby exert or increase a clamping force on said battery.

3. The electronics module according to claim 1, wherein said circuit carrier extends over said ring opening and is fixed to said mechanical holder on a side of said ring opening opposite to said hook-in structure.

4. The electronics module according to claim 1, wherein said hook structure of said circuit carrier is formed by an end section thereof folded over to form the hook structure.

5. The electronics module according to claim 4, wherein said end section is adhesively bonded on an adjacent partial section of said circuit carrier, and wherein a hooking area remains free of adhesive.

6. The electronics module according to claim 4, which comprises at least one chip disposed between said end section and said adjoining partial section and wherein a structural height thereof specifies a minimum distance between said end section and said partial section.

7. The electronics module according to claim 4, which further comprises at least one contact strip projecting from said end section or from said partial section beyond a folded edge between said end section and said partial section of said circuit carrier, said at least one contract strip having contact points for at least one further electronic component.

8. An electronics module for a hearing instrument to be worn in the auditory canal, the electronics module comprising:
a rechargeable battery;
a mechanical holder configured to receive said rechargeable battery in an intended assembly state of the electronics module;
said mechanical holder being formed as a clamp and, in the intended assembly state, partially enclosing a circumference of said rechargeable battery;
said mechanical holder comprising laterally protruding first and second positioning aids which, in the intended assembly state of the hearing instrument, are engaged with corresponding first and second positioning aids of a housing element of the hearing instrument for mutual positioning;
a circuit carrier and a chipset disposed on said circuit carrier;
said circuit carrier being band-shaped and, in the intended assembly state, being laid in sections on said mechanical holder and bent around said mechanical holder; and
said circuit carrier holding said mechanical holder in a closing direction.

9. The electronics module according to claim 8, wherein said first and second positioning aids of said mechanical holder are formed as pins.

10. The electronics module according to claim 8, wherein said mechanical holder is formed with a bolting eye configured to receive a securing pin for connecting said mechanical holder to the housing element of the hearing instrument.

11. The electronics module according to claim 10, wherein said first and second positioning aids are configured to hold said bolting eye in an intermediate assembly step congruent with a corresponding hole formed in the housing element of the hearing instrument.

12. An electronics module for a hearing instrument to be worn in the auditory canal, the electronics module comprising:
a rechargeable battery;
a mechanical holder configured to receive said rechargeable battery in an intended assembly state of the electronics module;
said mechanical holder being formed as a clamp and, in the intended assembly state, partially enclosing a circumference of said rechargeable battery;
a circuit carrier and a chipset disposed on said circuit carrier;
said circuit carrier being band-shaped and, in the intended assembly state, being laid in sections on said mechanical holder and bent around said mechanical holder, and said circuit carrier having an end section folded over to form a hook structure, and wherein said charging contact arrangement is diposed on an end area of said circuit carrier opposite the folded-over end section;
said circuit carrier holding said mechanical holder in a closing direction; and
a charging contact arrangement for charging said rechargeable battery, said charging contact arrangement being disposed on a side of said circuit carrier facing away from said rechargeable battery.

13. A hearing instrument base module for a hearing instrument to be worn in the auditory canal, the base module comprising:
an electronics module and a housing element of the hearing instrument;
said electronics module comprising:
a rechargeable battery;
a mechanical holder configured to receive said rechargeable battery in an intended assembly state of the electronics module;
said mechanical holder being formed as a clamp and, in the intended assembly state, partially enclosing a circumference of said rechargeable battery;
a circuit carrier and a chipset disposed on said circuit carrier;
said circuit carrier being band-shaped and, in the intended assembly state, being laid in sections on said mechanical holder and bent around said mechanical holder; and
said circuit carrier holding said mechanical holder in a closing direction;
said housing element being formed with a microphone opening and being fastened on said electronics module, with the microphone of said electronics module being aligned in fluidic communication with surroundings through said microphone opening in the intended final manufacturing state of the hearing instrument;
wherein said electronics module includes a ring seal, which is arranged between said circuit carrier and said housing element circumferentially around said microphone opening, and wherein said electronics module is clamped against said housing element by way of first and second positioning aids while loading the ring seal.

14. A hearing instrument base module for a hearing instrument to be worn in the auditory canal, the base module comprising:
an electronics module according to claim 1 and a housing element of the hearing instrument;
said electronics module comprising:
a rechargeable battery;
a mechanical holder configured to receive said rechargeable battery in an intended assembly state of the electronics module;
said mechanical holder being formed as a clamp and, in the intended assembly state, partially enclosing a circumference of said rechargeable battery;
a circuit carrier and a chipset disposed on said circuit carrier;
said circuit carrier being band-shaped and, in the intended assembly state, being laid in sections on said mechanical holder and bent around said mechanical holder; and
said circuit carrier holding said mechanical holder in a closing direction;

said housing element being formed with a microphone opening and being fastened on said electronics module, with the microphone of said electronics module being aligned in fluidic communication with surroundings through said microphone opening in the intended final manufacturing state of the hearing instrument; and said housing element having a substantially L-shaped form with a long leg and a short leg disposed approximately at right angles, said microphone opening being formed in the long leg, and wherein a charging opening is formed in the short leg, through which a charging contact arrangement is accessible.

15. The hearing instrument base module according to claim 14, which comprises a ring seal mounted between said housing element and said circuit carrier circumferentially around said charging opening.

16. A hearing instrument to be worn in the auditory canal, the hearing instrument comprising:

a main housing formed with a housing opening facing away from an eardrum of a hearing aid user in an intended worn state of the hearing instrument;

a base module having an electronics module according to claim 1 and a housing element;

said housing element being formed with a microphone opening and being fastened on said electronics module, with the microphone of said electronics module being aligned in fluidic communication with surroundings through said microphone opening in an intended final manufacturing state of the hearing instrument; and said base module being inserted into said main housing and closing said housing opening by way of said housing element.

17. The hearing instrument according to claim 16, wherein said main housing is formed with a fastening hole configured to enable a securing pin to pass through a hole formed in said housing element and a bolting eye formed in said mechanical holder.

* * * * *